(12) United States Patent
Alayavalli et al.

(10) Patent No.: US 10,910,238 B2
(45) Date of Patent: Feb. 2, 2021

(54) HEATER PEDESTAL ASSEMBLY FOR WIDE RANGE TEMPERATURE CONTROL

(71) Applicant: Applied Materials, Inc., Santa Clara, CA (US)

(72) Inventors: Kaushik Alayavalli, Sunnyvale, CA (US); Ajit Balakrishna, Santa Clara, CA (US); Sanjeev Baluja, Campbell, CA (US); Amit Kumar Bansal, Milpitas, CA (US); Matthew James Busche, Santa Clara, CA (US); Juan Carlos Rocha-Alvarez, San Carlos, CA (US); Swaminathan T. Srinivasan, Pleasanton, CA (US); Tejas Ulavi, San Jose, CA (US); Jianhua Zhou, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 454 days.

(21) Appl. No.: 15/703,666

(22) Filed: Sep. 13, 2017

(65) Prior Publication Data

US 2018/0082866 A1    Mar. 22, 2018

Related U.S. Application Data

(60) Provisional application No. 62/398,310, filed on Sep. 22, 2016.

(51) Int. Cl.
*H01L 21/67* (2006.01)
*H01L 21/687* (2006.01)

(52) U.S. Cl.
CPC .... *H01L 21/67103* (2013.01); *H01L 21/6719* (2013.01); *H01L 21/67109* (2013.01);
(Continued)

(58) Field of Classification Search
CPC ......... H01L 21/67103; H01L 21/67248; H01L 21/67109; H01L 21/68792;
(Continued)

(56) References Cited

U.S. PATENT DOCUMENTS

| 6,558,508 B1 * | 5/2003 | Kawakami ........ H01L 21/67103 |
| | | 156/345.51 |
| 9,698,074 B2 | 7/2017 | Merry et al. |

(Continued)

FOREIGN PATENT DOCUMENTS

| KR | 10-2012-0106977 A | 9/2012 |
| WO | 2013162697 A1 | 10/2013 |

OTHER PUBLICATIONS

Wikipedia—Diffusion Bonding.*
(Continued)

*Primary Examiner* — Tu B Hoang
*Assistant Examiner* — Vy T Nguyen
(74) *Attorney, Agent, or Firm* — Patterson + Sheridan LLP (57) ABSTRACT

Implementations of the disclosure generally relate to a semiconductor processing chamber and, more specifically, a heated support pedestal for a semiconductor processing chamber. In one implementation, a pedestal assembly is disclosed and includes a substrate support comprising a dielectric material and having a support surface for receiving a substrate, a resistive heater encapsulated within the substrate support, a hollow shaft coupled to a support member of the substrate support at a first end of the shaft, and a thermally conductive material disposed at an interface between the support member and the first end of the shaft.

17 Claims, 5 Drawing Sheets

(52) U.S. Cl.
CPC .. *H01L 21/67161* (2013.01); *H01L 21/67207* (2013.01); *H01L 21/67248* (2013.01); *H01L 21/68792* (2013.01)

(58) Field of Classification Search
CPC ........... H01L 21/67161; H01L 21/6719; H01L 21/67207; H01L 21/68757; H01L 21/67017; H01L 21/67126; H01L 21/67751; H01L 21/68742; H01L 21/68785; C23C 16/4586; C23C 16/4408; C23C 16/4412; C23C 16/455; C23C 16/4583; C23C 16/4584; C23C 16/46; C23C 16/463; C23C 14/541; C23C 16/4585; F02B 47/02; F02B 9/02; F02D 19/12; F02D 2041/389; F02D 41/0025; F02D 41/02; F02D 41/40; F02D 2200/022; F02F 3/28; F02M 25/0227; F02M 25/03; F02M 61/14; F02M 61/1806; F27D 2099/0008; F27D 3/0084; F27D 99/0006; H01J 37/32192; H01J 37/32211; H05B 3/70; H05B 3/748; E04F 21/165; E04F 21/1652; G01R 31/3648; G01R 31/389; Y10T 29/4935; Y10T 29/49373
USPC ......... 219/385, 443.1, 444.1, 468.1; 118/725
See application file for complete search history.

(56) References Cited

U.S. PATENT DOCUMENTS

| | | | |
|---|---|---|---|
| 2005/0051520 A1* | 3/2005 | Tanaka | H01L 21/67069 219/121.43 |
| 2006/0199131 A1* | 9/2006 | Kawasaki | H01L 21/68757 432/120 |
| 2007/0032097 A1 | 2/2007 | Chen et al. | |
| 2007/0169703 A1 | 7/2007 | Elliot et al. | |
| 2007/0267717 A1* | 11/2007 | Van Swearingen | H01P 3/06 257/530 |
| 2009/0314208 A1 | 12/2009 | Zhou et al. | |
| 2011/0147363 A1* | 6/2011 | Yap | H01L 21/67109 219/385 |
| 2012/0156877 A1 | 6/2012 | Yap et al. | |

OTHER PUBLICATIONS

International Search Report and Written Opinion for Application No. PCT/US2017/05137 dated Dec. 21, 2017.
Taiwan Office Action for Application No. 106129088 dated Mar. 5, 2019.
Korean Office Action for Application No. KR 10-2019-7011339 dated Jun. 2, 2020.
Taiwan Office Action for Application No. TW 108127817 dated May 18, 2020.

* cited by examiner

HEATER PEDESTAL ASSEMBLY FOR WIDE RANGE TEMPERATURE CONTROL

CROSS-REFERENCE TO RELATED APPLICATION

This application claims benefit of U.S. Provisional Patent Application Ser. No. 62/398,310, filed Sep. 22, 2016, which application is incorporated by reference herein.

BACKGROUND

Field

Implementations disclosed herein generally relate to a semiconductor processing chamber and, more specifically, a heated support pedestal assembly for a semiconductor processing chamber.

Description of the Related Art

Semiconductor processing involves a number of different chemical and physical processes whereby minute integrated circuits are created on a substrate. Layers of materials which make up the integrated circuit are created by processes including chemical vapor deposition, physical vapor deposition, epitaxial growth, and the like. Some of the layers of material are patterned using photoresist masks and wet or dry etching techniques. The substrates utilized to form integrated circuits may be silicon, gallium arsenide, indium phosphide, glass, or other appropriate materials.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a substrate support or pedestal disposed therein to support the substrate during processing. In some processes, the pedestal may include an embedded heater adapted to control the temperature of the substrate and/or provide elevated temperatures that may be used in the process. Proper temperature control and uniform heating of the substrate during substrate processing is very important, particularly as the size of integrated circuits decreases. Conventional supports with embedded heaters often have numerous hot and cold spots which affect the quality of films deposited on the substrate.

Therefore, there is a need for a pedestal assembly that provides active temperature control.

SUMMARY

Implementations of the disclosure generally relate to a semiconductor processing chamber and, more specifically, a heated support pedestal for a semiconductor processing chamber. In one implementation, a pedestal assembly is disclosed and includes a substrate support comprising a dielectric material and having a support surface for receiving a substrate, a resistive heater encapsulated within the substrate support, a hollow shaft coupled to a support member of the substrate support at a first end of the shaft, and a thermally conductive material disposed at an interface between the support member and the first end of the shaft.

In another implementation, pedestal assembly for a semiconductor processing chamber is disclosed and includes a substrate support comprising a dielectric material and having a support surface for receiving a substrate, a resistive heater encapsulated within the substrate support, a shaft having a hollow core and coupled to a support member of the substrate support at a first end of the hollow core, and a thermal break including and air gap positioned between the heating element and the cooling channel assembly.

In another implementation, pedestal assembly for a semiconductor processing chamber is disclosed and includes a substrate support comprising a dielectric material and having a support surface for receiving a substrate, a resistive heater encapsulated within the substrate support, a shaft having a hollow core and coupled to a support member of the substrate support at a first end of the hollow core, a thermal break including and air gap positioned between the heating element and the cooling channel assembly, and a thermally conductive material disposed at an interface between the support member and the first end of the hollow core.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations of the disclosure generally relate to a semiconductor processing chamber and, more specifically, a heated support pedestal for a semiconductor processing chamber. Implementations disclosed herein are illustratively described below in reference to plasma chambers. In one implementation, the plasma chamber is utilized in a plasma enhanced chemical vapor deposition (PECVD) system. Examples of PECVD systems that may be adapted to benefit from the implementations described herein include a PRODUCER® SE CVD system, a PRODUCER® GT™ CVD system or a DXZ® CVD system, all of which are commercially available from Applied Materials, Inc., Santa Clara, Calif. The Producer® SE CVD system (e.g., 200 mm or 300 mm) has two isolated processing regions that may be used to deposit thin films on substrates, such as conductive films, silanes, carbon-doped silicon oxides and other materials. Although the exemplary implementation includes two processing regions, it is contemplated that the implementations described herein may be used to advantage in systems having a single processing region or more than two processing regions. It is also contemplated that the implementations described herein may be utilized to advantage in other plasma chambers, including etch chambers, ion implantation chambers, plasma treatment chambers, and stripping chambers, among others. It is further contemplated that the implementations described herein may be utilized to advantage in plasma processing chambers available from other manufacturers.

Implementations of the pedestal described herein address the need for active temperature control of a substrate during processing at all times over a complete process cycle. Certain implementations described herein provide higher temperature control at temperatures upwards of 400° C. using an embedded heating element with a minimal temperature gradient (<10° C.) with unique element patterns. Certain implementations described herein can remove larger thermal loads (e.g. upwards of 2,000 Watts) from either an external source like RF coupling or an internal source such as the embedded heating element by flowing active coolant through body of the pedestal. Certain implementations described herein provide a lower desired temperature gradient through the active control of the heater element together with the flow rate of the coolant through the body of the pedestal.

Certain implementations described herein provide the ability to actively control the temperature of the substrate over a wide range while the substrate is subjected to numerous processes and chamber conditions (e.g. heater faceplate, coupling RF struck in chamber, process gases, chemistry, etc.). Active temperature control of a substrate includes spatial temperature control and/or transient temperature control.

Spatial temperature control includes creating a desired radial temperature profile within or on the substrate. Spatial temperature control is typically performed by a pedestal having multiple concentric heater zones. Desired radial profiles may include a uniform temperature, an edge-hot temperature profile, or an edge-cold temperature profile. Transient temperature control includes maintaining the desired temperature profile of the substrate in the presence of varying external heat loads. Transient temperature control is typically achieved by modulating the heater zone powers appropriately. Active temperature control may be achieved through two active temperature fluxes; first, heat is provided to the pedestal by an embedded heating element, and second, heat is removed from the pedestal by an internal coolant path. Thus the temperature of the pedestal surface (which the substrate rests on) can be controlled to a desired temperature set point by controlling the level of these two fluxes. Increased heat can be generated by delivering more power to the heating element and reducing the flow rate of the coolant (or reducing the coolant inlet temperature), or the reverse can be done to achieve a cooler pedestal temperature. The wider temperature control range is achieved through controlling the interactions between the heat sources (internal from the heating element or external from the chamber or process conditions) and the heat drain (internal active coolant). In one implementation, this is achieved by positioning the heating element in the support body closer to the support surface where the substrate rests to maximize the highest temperature that can be achieved and by positioning the cooling channel in the lower body of the shaft at a height to drain out the desired amount of heat.

In addition to accurate temperature control, users sometimes require increased system throughput. One way to improve throughput is to increase deposition rate by increasing radio frequency (RF) power. However, an increase in RF power creates a corresponding increase in a plasma heat load imparted on the pedestal. For currently desired RF power levels, the plasma heat load may be as high as 1,000 Watts (W).

To maintain a stable substrate temperature, heat flow into the pedestal should be balanced with heat flow out of the pedestal. The difficulty of achieving this balance varies with process temperature. For example, at high operating temperatures (e.g. about 650 degrees C.) radiative heat loss is high and more than sufficient to offset the plasma heat load. However at "moderate" temperature (e.g. less than about 400 degrees C.) radiative heat loss is much lower (e.g. approximately 300 W at 350 degrees C.). Implementations of a pedestal assembly as described herein may be utilized at these moderate temperatures.

Conventional pedestals for moderate temperature processes typically limit thermal conduction. Thus, the sum of thermal losses (radiative and conductive) is insufficient to balance large plasma heat loads, resulting in a loss of temperature control when high RF power is used during a deposition process.

In one implementation, a pedestal assembly is disclosed that includes a pedestal body coupled to a shaft. The pedestal body comprises a dielectric material, for example a ceramic material, such as aluminum nitride. The shaft comprises a conductive (electrically and thermally) material, for example an aluminum alloy, such as 6061 aluminum. The shaft may include a coolant path embedded therein that removes heat from the pedestal body. The shaft provides high thermal conductivity which contributes to the interaction of heat flow from heat sources to the coolant.

Figure 1:
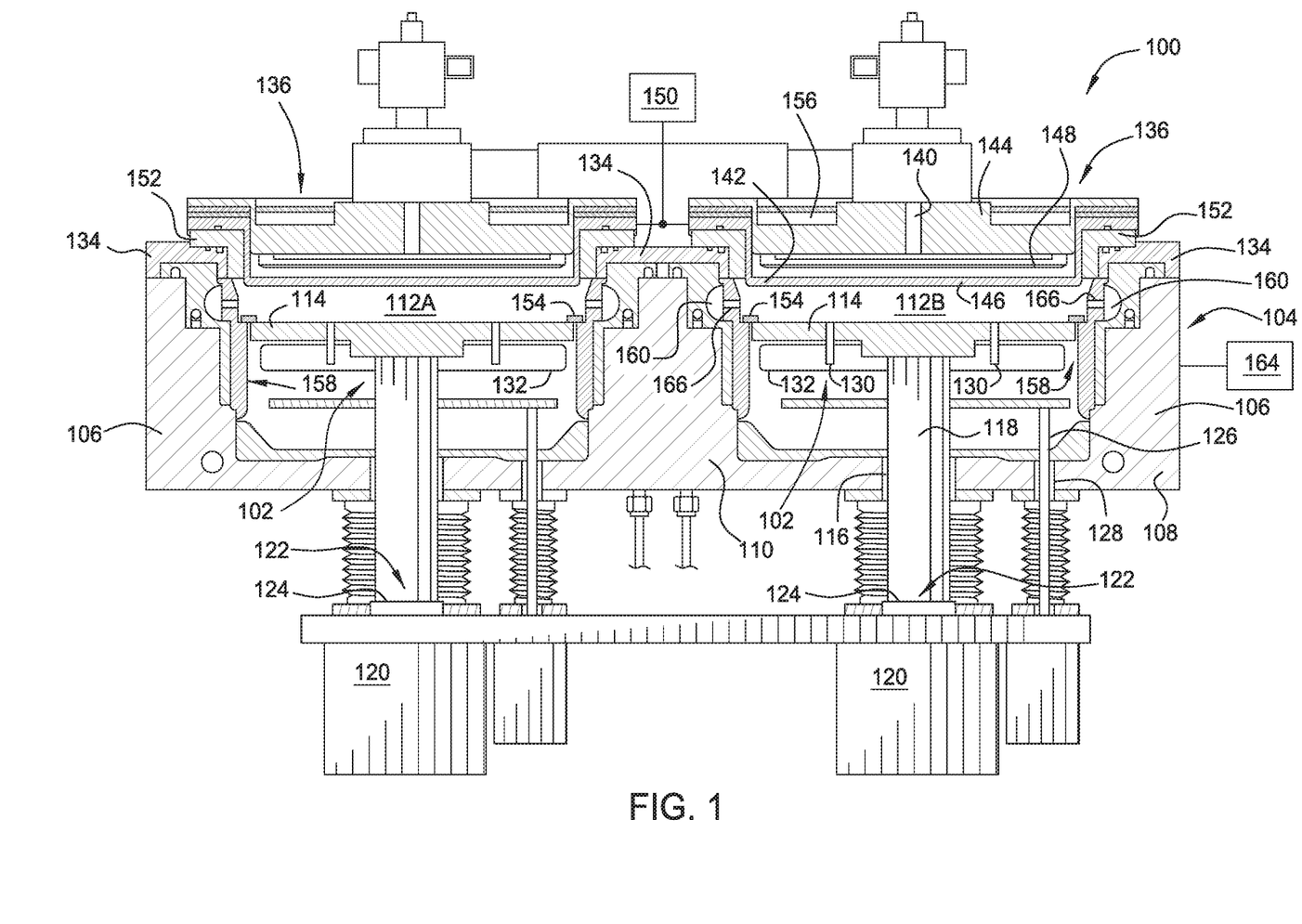
FIG. 1 is a partial cross sectional view of one implementation of a plasma system.

FIG. 1 is a partial cross sectional view of an exemplary plasma system 100 having a pedestal assembly 102 according to implementations described herein. As described herein, the pedestal assembly 102 comprises an active cooling system which allows for active control of the temperature of a substrate positioned on the pedestal assembly 102 over a wide temperature range while the substrate is subjected to numerous process and chamber conditions. The plasma system 100 generally comprises a processing chamber body 104 having sidewalls 106, a bottom wall 108, and an interior sidewall 110 defining a pair of processing regions 112A and 112B. Each of the processing regions 112A-B is similarly configured, and for the sake of brevity, only components in the processing region 112B will be described.

A pedestal body 114 is disposed in the processing region 112B through a passage 116 formed in the bottom wall 108 of the chamber body 104. The pedestal body 114 is adapted to support a substrate (not shown) on the upper surface thereof. The pedestal body 114 may include heating elements, for example resistive heating elements, to heat and control the substrate temperature at a desired process temperature. Alternatively, the pedestal body 114 may be heated by a remote heating element, such as a lamp assembly.

The pedestal assembly 102 includes the pedestal body 114 that is coupled to a shaft 118. The shaft 118 couples to a power outlet or power box 120, which may include a drive system that controls the elevation and movement of the pedestal body 114 within the processing region 112B. The shaft 118 also contains electrical power interfaces to provide electrical power to the pedestal body 114. The shaft 118 also includes a coolant channel formed therein. The power box 120 also includes interfaces for electrical power and temperature indicators, such as a thermocouple interface. The shaft 118 also includes a base assembly 122 adapted to detachably couple to the power box 120. A circumferential ring 124 is shown above the power box 120. In one implementation, the circumferential ring 124 is a shoulder adapted as a mechanical stop or land configured to provide a mechanical interface between the base assembly 122 and the upper surface of the power box 120.

A rod 126 is disposed through a passage 128 formed in the bottom wall 108 and is utilized to activate substrate lift pins 130 disposed through the pedestal body 114. The substrate lift pins 130 selectively space a substrate from the pedestal body 114 to facilitate exchange of the substrate with a robot (not shown) utilized for transferring the substrate into and out of the processing region 112B through a substrate transfer port 132.

A chamber lid 134 is coupled to a top portion of the chamber body 104. The lid 134 accommodates one or more gas distribution systems 136 coupled thereto. The gas distribution system 136 includes a gas inlet passage 140 which delivers reactant and cleaning gases through a showerhead assembly 142 into the processing region 112B. The showerhead assembly 142 includes an annular base plate 144 having a blocker plate 148 disposed intermediate to a faceplate 146. A radio frequency (RF) source 150 is coupled to the showerhead assembly 142. The RF source 150 powers the showerhead assembly 142 to facilitate generation of plasma between the faceplate 146 of the showerhead assembly 142 and the pedestal body 114. In one implementation, the RF source 150 may be a high frequency radio frequency (HFRF) power source, such as a 13.56 MHz RF generator. In another implementation, RF source 150 may include a HFRF power source and a low frequency radio frequency (LFRF) power source, such as a 300 kHz RF generator. Alternatively, the RF source may be coupled to other portions of the processing chamber body 104, such as the pedestal body 114, to facilitate plasma generation. A dielectric isolator 152 is disposed between the lid 134 and showerhead assembly 142 to prevent conducting RF power to the lid 134. A shadow ring 154 may be disposed on the periphery of the pedestal body 114 that engages a substrate at a desired elevation of the pedestal body 114.

Optionally, a cooling channel 156 is formed in the annular base plate 144 of the gas distribution system 136 to cool the annular base plate 144 during operation. A heat transfer fluid, such as water, ethylene glycol, a gas, or the like, may be circulated through the cooling channel 156 such that the base plate 144 is maintained at a predefined temperature.

A chamber liner assembly 158 is disposed within the processing region 112B in very close proximity to the sidewalls 110, 106 of the chamber body 104 to prevent exposure of the sidewalls 110, 106 to the processing environment within the processing region 112B. The liner assembly 158 includes a circumferential pumping cavity 160 that is coupled to a pumping system 164 configured to exhaust gases and byproducts from the processing region 112B and control the pressure within the processing region 112B. A plurality of exhaust ports 166 may be formed on the chamber liner assembly 158. The exhaust ports 166 are configured to allow the flow of gases from the processing region 112B to the circumferential pumping cavity 160 in a manner that promotes processing within the system 100.

Figure 2A:
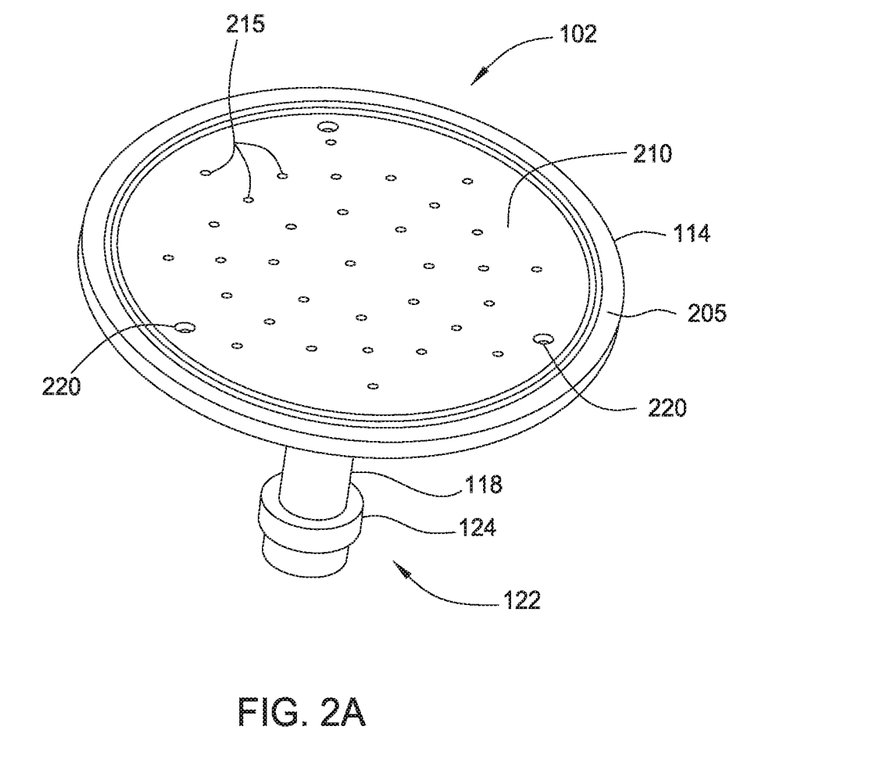
FIG. 2A is an isometric top view of one implementation of a pedestal assembly that may be utilized in the plasma system of FIG. 1.

FIG. 2A is an isometric top view of one implementation of a pedestal assembly 102 that may be utilized in the plasma system 100 of FIG. 1. The pedestal assembly 102 includes a pedestal body 114, a shaft 118 and a base assembly 122 opposite a circular substrate support 205. In one implementation, the shaft 118 is configured as a tubular member or hollow shaft. The substrate support 205 includes a substrate receiving surface or support surface 210 that is substantially planar. The support surface 210 may be adapted to support a 200 mm substrate, a 300 mm substrate, or a 450 mm substrate. In one implementation, the support surface 210 includes a plurality of structures 215, which may be bumps or protrusions extending above a plane of the support surface 210. The height of each of the plurality of structures 215 may be substantially equal to provide a substantially planar substrate receiving plane or surface that is slightly elevated or spaced-away from the support surface 210. The substrate support 205 also includes a plurality of openings 220 formed therethrough that are adapted to receive a lift pin 130 (FIG. 1).

In one implementation, the pedestal body 114 is made of a ceramic material, such as aluminum nitride, and the shaft 118 is made of a thermally conductive metallic material, such as aluminum.

In one implementation, the support surface 210 of the pedestal body 114 is textured. The support surface 210 may be textured using techniques known in the art, for example, bead blasting, an etch-back process, or combinations thereof. In one implementation, the root mean square ("RMS") roughness of the textured support surface 210 of the pedestal body 114 may be from about 0.75 microns to about 6 microns, for example, between about 1.5 microns and about 5 microns, for example about 2 microns.

Figure 2B:
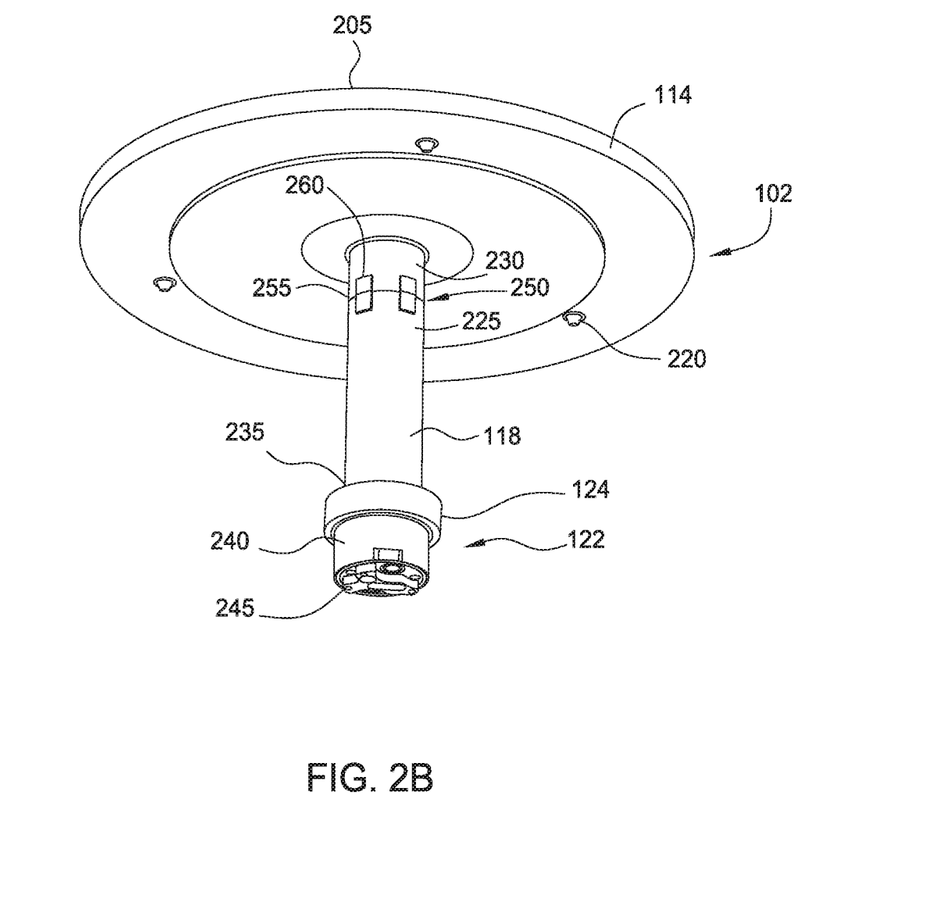
FIG. 2B is an isometric bottom view of the pedestal assembly of FIG. 2A.

FIG. 2B is an isometric bottom view of the pedestal assembly 102 of FIG. 2A. The shaft 118 includes a first end 225 that is coupled to a support member 230 of the pedestal body 114. The shaft 118 also includes a second end 235 coupled to the base assembly 122 opposite the substrate support 205. In this implementation, the base assembly 122 includes a slotted conductive portion 240 that is coupled to and/or containing a dielectric plug 245. In one implementation, the slotted conductive portion 240 may be configured as a plug or a male interface adapted to mate with the power box 120 (FIG. 1). In the implementation depicted in FIG. 2B, the conductive portion 240 may be circular in cross-section having slots formed at least partially through an outer surface or wall. The dielectric plug 245 may be configured as a socket or a female interface or, alternatively, comprising a portion or portions that are configured as a socket or female interface adapted to receive or mate with electrical connections within the power box 120. In one implementation, the slotted conductive portion 240 may be an integral extension of the shaft 118 and made of an aluminum material, while the dielectric plug 245 is made of a PEEK resin.

The base assembly 122 also includes the circumferential ring 124 adapted to receive an O-ring (not shown) that interfaces with the power box 120 depicted in FIG. 1. In this implementation, the slotted conductive portion 240 includes an opening adapted to receive the dielectric plug 245 and the dielectric plug 245 fastens to the slotted conductive portion 240. The dielectric plug 245 also includes openings or sockets formed therein to receive electrical leads from the power box 120 (shown in FIG. 1).

The support member 230 is coupled to the first end 225 of the shaft 118 at a thermal interface 250. The thermal interface 250 may be a bond comprising a thermally conductive material 255 disposed between mating surfaces of the first end 225 of the shaft 118 and the support member 230. The first end 225 of the shaft 118 and the support member 230 may be detachably coupled to each other by one or more fastener assemblies 260.

Figures 3A, 3B, 3C:
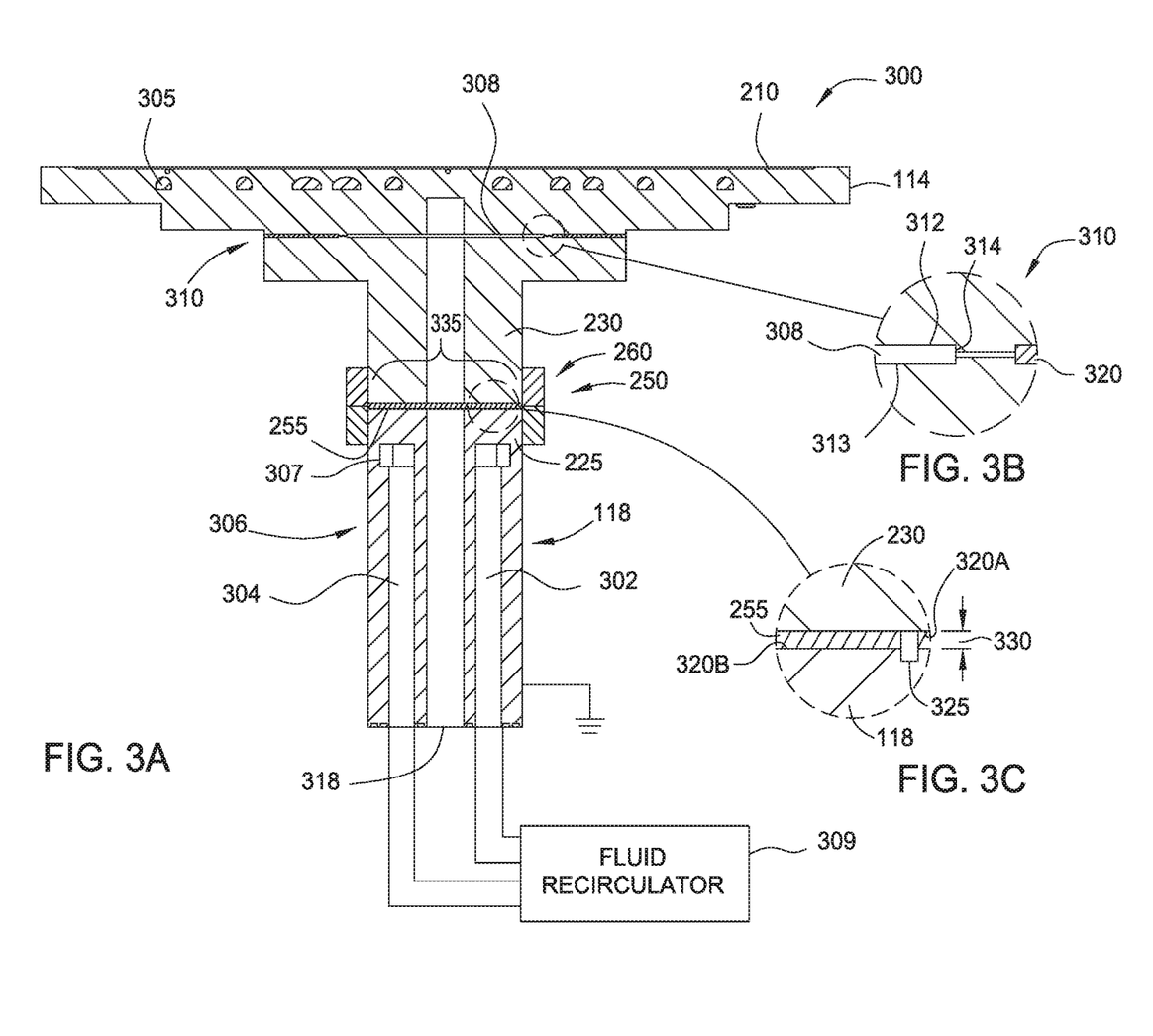
FIG. 3A is a cross-sectional side view of another implementation of a pedestal assembly that may be used as the pedestal assembly of FIGS. 1-2B.
FIG. 3B is an enlarged cross-sectional view of the pedestal assembly of FIG. 3A.
FIG. 3C is an enlarged cross-sectional view of the pedestal assembly of FIG. 3A.

FIG. 3A is a cross-sectional side view of one implementation of a pedestal assembly 300. The pedestal assembly 300 may be used as the pedestal assembly 102 of FIGS. 1-2B. FIG. 3B is an enlarged cross-sectional view of the pedestal assembly 300 of FIG. 3A. In one implementation, temperature control of a substrate (not shown) on the pedestal assembly 300 is provided by one or more of a resistive heater 305, a shaft 118 with a cooling channel assembly 306, and a thermal break 308, and the thermal interface 250.

The resistive heater 305 is disposed or encapsulated in the pedestal body 114. The thermal break 308 is provided in the pedestal body 114 adjacent to or at an interface 310 between the pedestal body 114 and the support member 230. The cooling channel assembly 306 has a cooling channel 307, a cooling channel inlet 302 and a cooling channel outlet 304. The cooling channel inlet 302 and the cooling channel outlet 304 may be coupled to a fluid re-circulator 309 for supplying a heat transfer medium or "coolant" to the cooling channel assembly 306. In one implementation, the cooling channel 307 is a ring-shaped channel positioned in the body of the shaft 118 and encircles a hollow portion 318 of the shaft 118.

In one implementation, the thermal break 308 increases the thermal resistance around the center of the support surface 210 of the pedestal body 114 thereby acting as a cold spreader. This may reduce a cold spot that may be present in the center of the support surface 210 of the pedestal body 114. With reference to FIG. 3B, the thermal break 308 is formed by an upper wall 312, an opposing lower wall 313, and a peripheral wall 314 which surrounds the thermal break 308. The thermal break 308 may include an air gap or void contained by the upper wall 312, the lower wall 313, and the peripheral wall 314.

In one implementation, the peripheral wall 314 is circular thus giving the thermal break 308 a circular shape. The thermal break 308 may also have any other shapes which provide for the desired amount of thermal control. For example, the thermal break 308 may have a shape selected from other shapes such as ovals, squares, rectangles, and non-uniform shapes. In one implementation, the thermal break 308 has a diameter between about 2 inches (5.1 cm) and about six inches (15.2 cm). In one implementation, the thermal break 308 has a diameter between about 3 inches (7.6 cm) and about 4 inches (10.2 cm). The diameter of the thermal break 308 may be varied in order to provide the desired amount of heat control. The distance between the upper wall and the lower wall (e.g. the height) of the thermal break 308 may also be varied in order to provide the desired amount of heat control. In one implementation, the height of the thermal break 308 is between about 0.1 inches (0.3 cm) and about 1 inch (2.5 cm). In another implementation, the height of the thermal break 308 is between about 0.4 inches (1 cm) and about 0.5 inches (1.3 cm).

The interface 310 between the pedestal body 114 and the support member 230 includes a bond 320. The bond 320 may be include direct bonding, diffusion bonding, co-sintering and/or co-firing at temperatures of about 1,200 degrees C. to about 1,500 degrees C. The bond 320 may extend to and/or form the peripheral wall 314 of the thermal break 308.

In one implementation, the cooling channel inlet 302 is a longitudinal channel extending through the shaft 118 of the pedestal assembly 102. A first end of the cooling channel inlet 302 is coupled with fluid recirculator 309 and a second end of the cooling channel inlet 302 is fluidly coupled with the cooling channel 307. In one implementation, the cooling channel outlet 304 is a longitudinal channel extending through the shaft 118 of the pedestal assembly 114. A first end of the cooling channel outlet 304 is coupled with the cooling channel 307 and a second end of the cooling channel outlet is coupled with the fluid recirculator 309.

FIG. 3C is an enlarged cross-sectional view of a portion The thermal interface 250 includes a mating surface 320A of the support member 230 and a mating surface 320B of the shaft 118. An annular O-ring groove 325 may be included in the thermal interface 250. The thermally conductive material 255 may be disposed between the mating surface 320A and 320B at a thickness 330 of about 0.001 inches. The thermally conductive material 255 may have a thermal conductivity of about 4.0 watts per meter Kelvin (W/m·K). Examples include silicone and/or acrylic based thermal greases or adhesives doped with a thermally conductive material, such as aluminum, silver (Ag), aluminum doped oxide, aluminum nitride, beryllium oxide, silicon carbide or diamonds. Another example of the thermally conductive material 255 includes a gap filling material sold under the trade name GAP FILLER 4000™ available from the Bergquist Company.

Referring again to FIG. 3A, the thermal interface 250 may include a surface area 335 of about 2 square inches. The surface area 335 is based primarily on design factors. For example, a hollow portion of the support member 230 and the shaft 118 must be large enough to accommodate electrical connections for the resistive heater 305, thermocouple leads, and the like, and the outer dimension of the support member 230 and the shaft 118 must be sized for integration into existing chamber bodies. Given the size of the surface area 335, and the thickness of the thermally conductive material 255, a heat flux of the thermal interface 250 may be about 1,500 Watts, or greater, and a temperature delta at the thermal interface 250 of about 10 degrees C.

In operation, heat produced by the resistive heater 305 and/or from a plasma heats the a substrate (not shown) and any excess heat flows from the ceramic pedestal body 114 and support member 230 to the aluminum shaft 118 through the thermal interface 250. The heat transfer fluid may be reused and continuously pumped through the cooling channel assembly 306 by the fluid recirculator 309. In certain implementations, the temperature of the pedestal body 114 may be about 350 degrees C. while the temperature of the shaft 118 may be about 100 degrees C., or less, in operation.

Figure 4A:
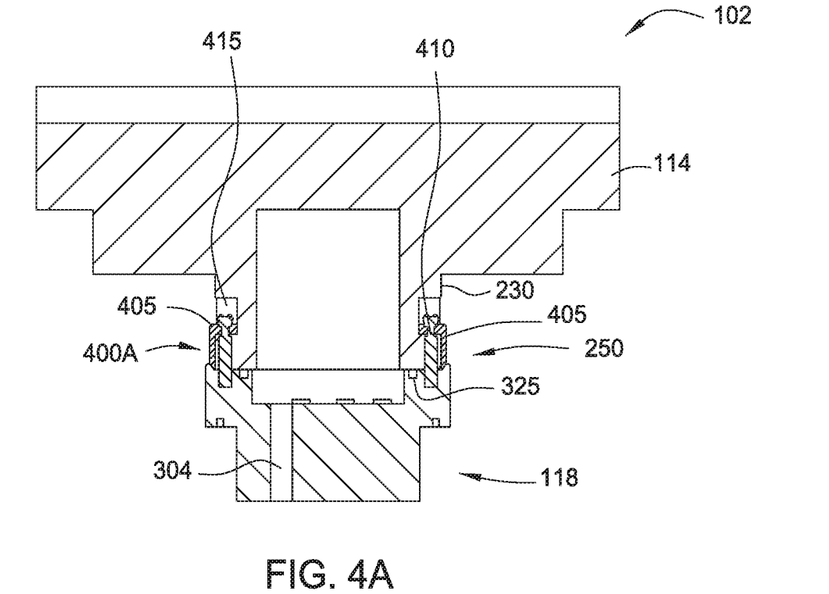
FIGS. 4A and 4B are cross-sectional views of a portion of a pedestal assembly showing different types of fastener assemblies that may be used to couple the support member to the shaft.
Figure 4B:
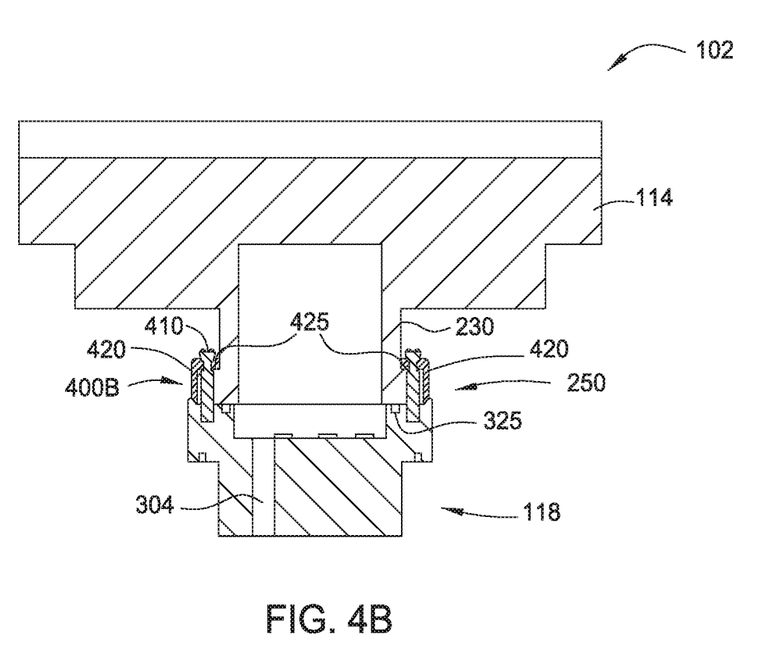

FIGS. 4A and 4B are cross-sectional views of a portion of a pedestal assembly 102 showing different types of fastener assemblies that may be used to couple the support member 230 to the shaft 118. FIG. 4A shows a fastener assembly 400A that is a "claw" type assembly and FIG. 4B shows a fastener assembly 400B that is a "split-ring" type assembly.

The fastener assembly 400A includes one or more claw clamps 405 that clamp between the support member 230 and the shaft 118. The one or more claw clamps 405 may include two or more annular segments that are adapted to surround a circumference of the support member 230 at the thermal interface 250. One or more fasteners 410 may be utilized to clamp the support member 230 to the shaft 118. The fasteners 410 and the claw clamps 405 may be disposed in recesses 415 formed in the support member 230. The recesses 415 may be formed in a circumference of the support member 230 at intermittent intervals.

The fastener assembly 400B includes one or more rings 420 that clamp between the support member 230 and the shaft 118. The one or more rings 420 may include two or more annular segments that are adapted to surround a circumference of the support member 230 at the thermal interface 250. One or more fasteners 410 may be utilized to clamp the support member 230 to the shaft 118. The rings 420 may be tightened against a shoulder 425 of the support member 230. A difference between the one or more rings 420 and the claw clamps 405 is that the rings 420 include a continuous inwardly extending member that contacts the shoulder 425 of the support member 230 while the claw clamps 405 has an inwardly extending member that contacts the shoulder 425 of the support member 230 at intermittent intervals corresponding with the recesses 415.

While the foregoing is directed to implementations of the present disclosure, other and further implementations of the disclosure may be devised without departing from the basic scope thereof, and the scope thereof is determined by the claims that follow.

The invention claimed is:

1. A pedestal assembly for a semiconductor processing chamber, comprising:
   a substrate support comprising a dielectric material and having a support surface for receiving a substrate;
   a resistive heater encapsulated within the substrate support;
   a shaft having a hollow core and coupled to one end of a support member of the substrate support at a first end of the hollow core, wherein another end of the support member is coupled to the substrate support;
   a thermally conductive material disposed at an interface between the one end of the support member and the first end of the hollow core, wherein the thermally conductive material has a thermal conductivity of 4.0 watts per meter Kelvin, wherein the support member includes a plurality of recesses formed in an outer circumference thereof adjacent to the interface between the support member and the shaft, wherein each of the plurality of recesses are spaced apart from each other, a fastener assembly including a plurality of clamps coupled with a plurality of fasteners that are disposed in the plurality of recesses to clamp the support member to the shaft, and wherein the interface includes an annular groove;
   a base assembly disposed on a second end of the hollow core of the shaft in an opposing relation to the first end of the hollow core that is coupled to the one end of the support member of the substrate support; and
   a thermal break including an air gap surrounded by a bond layer positioned between another end of the support member and the substrate support, wherein the support member is completely separate and distinct from the substrate support, wherein the support member is bonded to the substrate support by the bond layer.

2. The pedestal assembly of claim 1, wherein the shaft comprises a cooling channel assembly encircling the hollow core and disposed within the shaft for removing heat from the substrate support via an internal cooling path.

3. The pedestal assembly of claim 2, wherein the substrate support has the thermal break positioned between the resistive heater and the cooling channel assembly.

4. The pedestal assembly of claim 3, wherein the thermal break comprises:
   an upper wall;
   an opposing lower wall; and
   a peripheral wall which surrounds the thermal break, wherein the peripheral wall is circular.

5. The pedestal assembly of claim 4, wherein the thermal break has a diameter between 7.6 cm and 10.2 cm and a height of between 1 cm and 1.3 cm.

6. A pedestal assembly for a semiconductor processing chamber, comprising:
   a substrate support comprising a pedestal body including a dielectric material and having a support surface for receiving a substrate;
   a resistive heater encapsulated within the pedestal body;
   a support member coupled to the pedestal body by a bond layer at one end of the support member, wherein the support member is completely separate and distinct from the pedestal body;
   a shaft having a hollow core and coupled to another end of the support member at a first end of the hollow core, the shaft having a cooling channel assembly surrounding the hollow core;
   a thermal break including an air gap surrounded by the bond layer positioned between the pedestal body and the support member;
   a plurality of fasteners positioned around an outer surface of the support member at an interface between the support member and the shaft, a thermally conductive material disposed at the interface between another end of the support member and the first end of the hollow core, wherein the support member includes a plurality of recesses formed in an outer circumference thereof adjacent to the interface between the support member and the shaft, wherein each of the plurality of recesses are spaced apart from each other, and a plurality of clamps are coupled with the plurality of fasteners that are disposed in the plurality of recesses to clamp the support member to the shaft; and
   a base assembly disposed on a second end of the hollow core of the shaft at a position below the plurality of fasteners.

7. The pedestal assembly of claim 6, wherein the thermal break comprises:
   an upper wall;
   an opposing lower wall; and
   a peripheral wall formed by the bond layer which surrounds the air gap.

8. The pedestal assembly of claim 7, wherein the peripheral wall is circular.

9. The pedestal assembly of claim 6, wherein the thermal break has a diameter between 7.6 cm and 10.2 cm and a height of between 1 cm and 1.3 cm.

10. The pedestal assembly of claim 6, wherein:
    the thermally conductive material is surrounded by an annular groove disposed at the interface between the support member and the first end of the hollow core.

11. The pedestal assembly of claim 10, wherein the thermally conductive material has a thermal conductivity of 4.0 watts per meter Kelvin.

12. A pedestal assembly for a semiconductor processing chamber, comprising:
    a substrate support comprising a dielectric material and having a support surface for receiving a substrate;
    a resistive beater encapsulated within the substrate support;

a shaft having a hollow core and coupled to one end of a support member of the substrate support at a first end of the hollow core, the shaft having a cooling channel assembly disposed therein and surrounding the hollow core;

a thermal break including an air gap positioned between the resistive heater and the cooling channel assembly, the thermal break surrounded by a bond layer positioned between another end of the support member and the substrate support, wherein the support member is completely separate and distinct from the substrate support, wherein the support member is bonded to the substrate support by the bond layer;

a thermally conductive bond layer comprising a silicone based adhesive disposed at an interface between the one end of the support member and the first end of the hollow core;

a plurality of fasteners positioned around an outer surface of the support member at the interface between the support member and the shaft, wherein the support member includes a plurality of recesses formed in an outer circumference thereof adjacent to the interface between the support member and the shaft, and wherein each of the plurality of recesses are spaced apart from each other, and a plurality of clamps are coupled with the plurality of fasteners that are disposed in the plurality of recesses to clamp the support member to the shaft; and a base assembly disposed on a second end of the hollow core of the shaft in an opposing relation to the first end of the hollow core that is coupled to the one end of the support member of the substrate support.

13. The pedestal assembly of claim 12, wherein the thermal break comprises:

an upper wall;

an opposing lower wall; and a peripheral wall which surrounds the thermal break.

14. The pedestal assembly of claim 13, wherein the peripheral wall is circular.

15. The pedestal assembly of claim 12, wherein the thermal break has a diameter between 7.6 cm and 10.2 cm and a height of between 1 cm and 1.3 cm.

16. The pedestal assembly of claim 12, wherein the thermally conductive bond layer has a thermal conductivity of 4.0 watts per meter Kelvin.

17. The pedestal assembly of claim 3, wherein the thermal break has a diameter between 7.6 cm and 10.2 cm and a height of between 1 cm and 1.3 cm.

\* \* \* \* \*